(12) United States Patent
Fujikawa et al.

(10) Patent No.: US 8,766,699 B2
(45) Date of Patent: *Jul. 1, 2014

(54) SWITCHING CIRCUIT

(75) Inventors: Kazuhiro Fujikawa, Osaka (JP); Nobuo Shiga, Osaka (JP); Takashi Ohira, Toyohashi (JP); Kazuyuki Wada, Toyohashi (JP); Kazuya Ishioka, Toyohashi (JP); Hiroshi Ishioka, legal representative, Iwaki (JP)

(73) Assignees: Sumitomo Electric Industries, Ltd., Osaka-shi (JP); National University Corporation Toyohashi University of Technology, Toyohashi-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/490,240

(22) Filed: Jun. 6, 2012

(65) Prior Publication Data
US 2012/0306288 A1 Dec. 6, 2012

Related U.S. Application Data

(60) Provisional application No. 61/493,835, filed on Jun. 6, 2011.

(30) Foreign Application Priority Data

Jun. 6, 2011 (JP) .................................. 2011-126341

(51) Int. Cl.
*H03K 17/30* (2006.01)
(52) U.S. Cl.
USPC ............ 327/382; 327/423; 327/494; 327/587
(58) Field of Classification Search
USPC ................ 327/587, 588, 494–497, 423, 382
See application file for complete search history.

(56) References Cited

U.S. PATENT DOCUMENTS 4,811,192 A * 3/1989 Egawa .......................... 363/132
5,486,790 A * 1/1996 Huijsing et al. ............... 330/260
(Continued)

FOREIGN PATENT DOCUMENTS

JP 05-067957 3/1993
JP H7-047993 11/1995
(Continued)

OTHER PUBLICATIONS

International Preliminary Report on Patentability and Written Opinion in PCT International Application No. PCT/JP2012/058996, dated Dec. 27, 2013.

*Primary Examiner* — Thomas J Hiltunen
(74) *Attorney, Agent, or Firm* — Venable LLP; Michael A. Sartori

(57) ABSTRACT

A switching circuit according to one embodiment includes first to fourth semiconductor switch elements. A pulse-like signal is applied to each input terminal of the switch elements such that when the first and fourth switch elements are in an ON (OFF) state, the remaining switch elements are in an OFF (ON) state. The switching circuit includes first and second capacitance elements. The first capacitance elements connected between an output terminal of the second semiconductor switch element and the second capacitance elements connected between an input terminal of the second semiconductor switch element and an output terminal of the fourth semiconductor switch element has a capacitance to reduce a parasitic capacitance between the input and output terminals of each of the fourth and second switch elements at a frequency N times (N is an integer of 1 or more) as high as a clock frequency of the pulse-like signal.

2 Claims, 10 Drawing Sheets

(56) References Cited

U.S. PATENT DOCUMENTS

| | | | |
|---|---|---|---|
| 6,114,907 A * | 9/2000 | Sakurai | 330/253 |
| 6,377,095 B1 * | 4/2002 | Kuo | 327/170 |
| 6,750,704 B1 * | 6/2004 | Connell et al. | 330/9 |
| 6,931,560 B1 * | 8/2005 | Porter et al. | 713/400 |
| 7,253,686 B2 * | 8/2007 | Ali | 330/259 |
| 7,525,381 B2 * | 4/2009 | Murden et al. | 330/261 |
| 7,598,788 B2 * | 10/2009 | Cao | 327/266 |
| 7,705,677 B2 * | 4/2010 | Forbes et al. | 330/253 |
| 8,344,805 B2 * | 1/2013 | Wang et al. | 330/260 |
| 2005/0093628 A1 * | 5/2005 | Chen | 330/253 |
| 2013/0207724 A1 * | 8/2013 | Wilson | 330/274 |

FOREIGN PATENT DOCUMENTS

| | | |
|---|---|---|
| JP | 11-149605 | 6/1999 |
| JP | 2010-028522 | 2/2010 |

\* cited by examiner

US 8,766,699 B2

SWITCHING CIRCUIT

CROSS-REFERENCE TO RELATED APPLICATIONS

This application claims priority to Provisional Application Ser. No. 61/493,835, filed on Jun. 6, 2011 and claims the benefit of Japanese Patent Application No. 2011-126341, filed on Jun. 6, 2011, all of which are incorporated herein by reference in their entirety.

BACKGROUND

1. Field

Embodiments of the present invention relate to a switching circuit.

2. Description of the Related Art

There are known switching circuits using semiconductor switch elements such as transistors (See Japanese Utility Model Publication No. Hei-7-47993). Since parasitic capacitance exists in the semiconductor switch element due to its configuration, a charge and discharge time of the parasitic capacitance is required when the semiconductor switch element performs a switching operation. As a method for reducing the charge and discharge time of the parasitic capacitance, the semiconductor switch element is overdriven in Japanese Utility Model Publication No. Hei-7-47993.

SUMMARY

In the overdrive, however, it is necessary to supply more voltage (or more current) than is required to drive the semiconductor switch element. Thus, the semiconductor switch element may be damaged in some cases, and the power efficiency of the switching circuit is easily reduced.

It is an object of the present invention to provide a switching circuit which can increase a switching speed and can also improve power efficiency without performing overdrive.

A switching circuit according to one aspect of the present invention is a switching circuit including first to fourth semiconductor switch elements each having an input terminal, an output terminal, and a common terminal, an output terminal of the first semiconductor switch element and an output terminal of the third semiconductor switch element being connected to each other, a common terminal of the second semiconductor switch element and a common terminal of the fourth semiconductor switch element being connected to each other, a common terminal of the first semiconductor switch element and an output terminal of the second semiconductor switch element being connected to each other, a common terminal of the third semiconductor switch element and an output terminal of the fourth semiconductor switch element being connected to each other, and a pulse-like signal being applied to each input terminal of the first to fourth semiconductor switch elements such that the second and third semiconductor switch elements are in an OFF state when the first and fourth semiconductor switch elements are in an ON state and the second and third semiconductor switch elements are in an ON state when the first and fourth semiconductor switch elements are in an OFF state. The switching circuit further includes a first capacitance element connected between the output terminal of the second semiconductor switch element and the input terminal of the fourth semiconductor switch element, and a second capacitance element connected between the input terminal of the second semiconductor switch element and the output terminal of the fourth semiconductor switch element. The first capacitance element has a capacitance to reduce a parasitic capacitance between the input terminal and the output terminal of the fourth semiconductor switch element to less than that obtained when the first capacitance element is not connected at a frequency N times (N is an integer of 1 or more) as high as a clock frequency of the pulse-like signal supplied to the fourth semiconductor switch element. The second capacitance element has a capacitance to reduce a parasitic capacitance between the input terminal and the output terminal of the second semiconductor switch element to less than that obtained when the second capacitance element is not connected at a frequency N times (N is an integer of 1 or more) as high as a clock frequency of the pulse-like signal supplied to the second semiconductor switch element.

In the above configuration, the influence of the parasitic capacitance itself between the input terminal and the output terminal as the parasitic capacitances existing in the fourth and second semiconductor switch elements is reduced by the first and second capacitance elements. Accordingly, a switching speed can be increased, and power efficiency can be improved without performing overdrive.

The capacitance of the first capacitance element may be substantially equal to the parasitic capacitance between the input terminal and the output terminal of the fourth semiconductor switch element. The capacitance of the second capacitance element may be substantially equal to the parasitic capacitance between the input terminal and the output terminal of the second semiconductor switch element.

In the configuration, the influence of the parasitic capacitance itself between the input terminal and the output terminal as the parasitic capacitances existing in the fourth and second semiconductor switch elements can be more reliably reduced by the first and second capacitance elements.

As mentioned above, the the switching circuit which can increase the switching speed and can also improve the power efficiency without performing overdrive can be provided.

DETAILED DESCRIPTION

Figure 1:
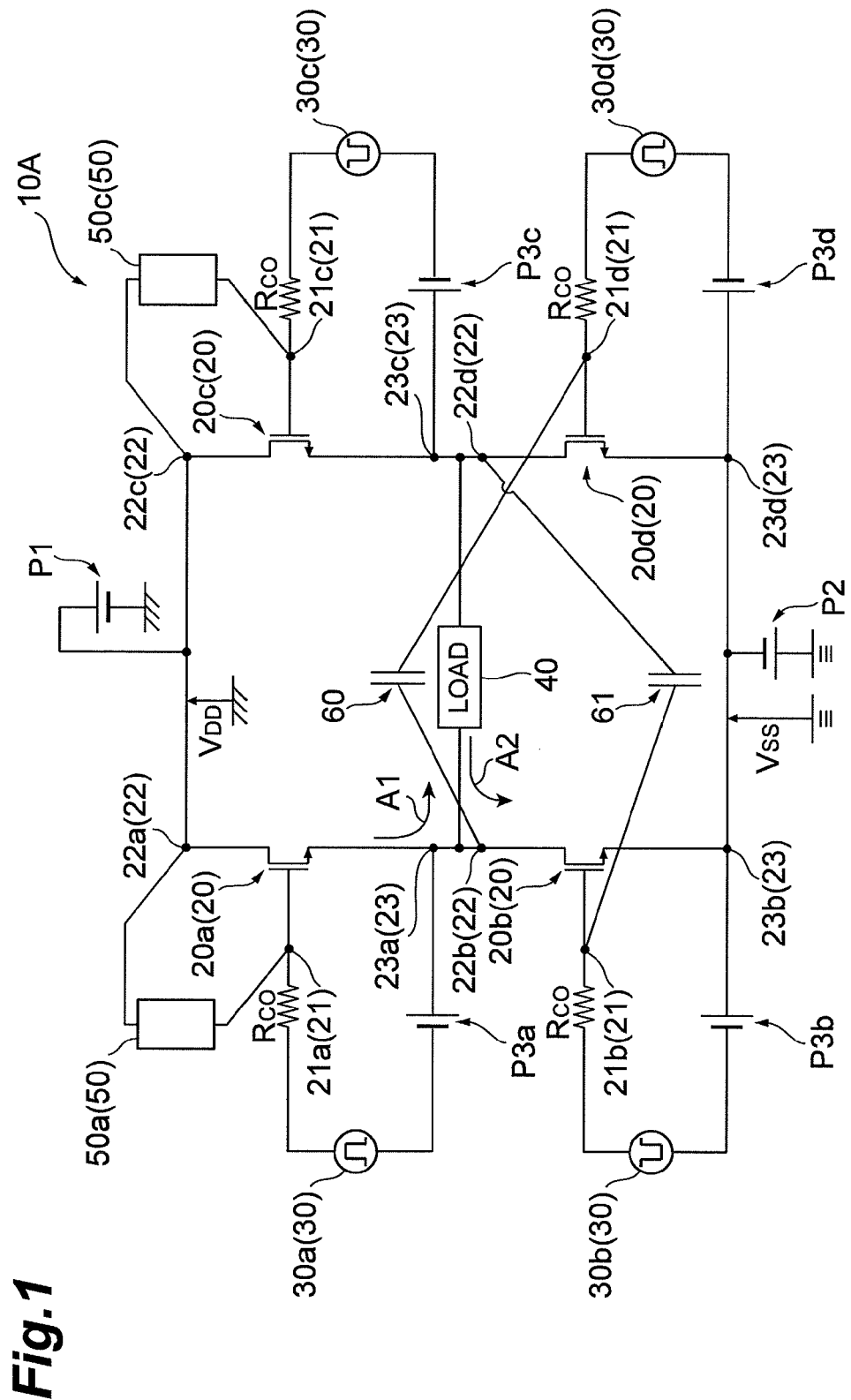
FIG. 1 is a circuit diagram illustrating the schematic configuration of a switching circuit according to a first embodiment.

In the following, embodiments of the present invention will be described by reference to the drawings. In the description of the drawings, the same elements are assigned the same reference numerals to omit the overlapping description. The dimensional ratios in the drawings do not necessarily correspond to those of the description.

FIG. 1 is a circuit diagram illustrating the schematic configuration of a switching circuit according to one embodiment of the present invention. A switching circuit 10A is a differential switching circuit.

The switching circuit 10A includes four semiconductor switch elements 20, 20, 20, and 20. The semiconductor switch elements 20 are MOS field-effect transistors (MOSFET). Examples of the MOSFET include a power MOSFET. Each of the semiconductor switch elements 20 has a gate terminal 21 as an input terminal, a drain terminal 22 as an output terminal, and a source terminal 23 as a common terminal. In the following description, the four semiconductor switch elements 20, 20, 20, and 20 are also referred to as semiconductor switch elements 20a, 20b, 20c, and 20d when the four semiconductor switch elements 20 are separately described. The same applies to constituent elements of the semiconductor switch elements 20, and constituent elements provided corresponding to the semiconductor switch elements 20.

In the switching circuit 10A, a drain terminal 22a of the semiconductor switch element (a first semiconductor switch element) 20a and a drain terminal 22c of the semiconductor switch element (a third semiconductor switch element) 20c are connected to each other. A source terminal 23b of the semiconductor switch element (a second semiconductor switch element) 20b and a source terminal 23d of the semiconductor switch element (a fourth semiconductor switch element) 20d are connected to each other.

A first power source P1 and a second power source P2 are respectively connected to a connection point between the drain terminal 22a and the drain terminal 22c, and a connection point between the source terminal 23b and the source terminal 23d. The first power source P1 supplies a positive voltage $V_{DD}$ to the drain terminals 22a and 22c. The second power source P2 supplies a negative voltage $V_{SS}$ to the source terminals 23b and 23d.

A source terminal 23a of the semiconductor switch element 20a and a drain terminal 22b of the semiconductor switch element 20b are connected to each other. A source terminal 23c of the semiconductor switch element 20c and a drain terminal 22d of the semiconductor switch element 20d are connected to each other. That is, the semiconductor switch element 20a and the semiconductor switch element 20b, and the semiconductor switch element 20c and the semiconductor switch element 20d are respectively connected in series.

A connection point between the source terminal 23a and the drain terminal 22b, and a connection point between the source terminal 23c and the drain terminal 22d are connected via a load 40. The load 40 may be an inductive load such as an inductance element, or may be a resistive load.

The switching circuit 10A may include a drive circuit 30 that switches the respective semiconductor switch elements 20a, 20b, 20c, and 20d. The drive circuit 30 is a gate drive circuit that performs pulse width modulation (PWM) control of the respective semiconductor switch elements 20a to 20d. The drive circuit 30 supplies a PWM signal to the respective semiconductor switch elements 20a to 20d. In the following description, sections of the drive circuit 30 that respectively supply the PWM signals to the semiconductor switch elements 20a to 20d are also referred to as drive circuits 30a to 30d as shown in FIG. 1 so as to clarify the correspondence relationship with the semiconductor switch elements 20a to 20d. The drive circuit 30 may be commonly provided for the semiconductor switch elements 20a to 20d, or separately provided for each of the semiconductor switch elements 20a to 20d.

The drive circuits 30a and 30d respectively supply positive-phase PWM signals to gate terminals 21a and 21d of the semiconductor switch elements 20a and 20d. Similarly, the drive circuits 30b and 30c respectively supply negative-phase PWM signals to gate terminals 21b and 21c of the semiconductor switch elements 20b and 20c. The PWM signals have a modulation frequency $f_M$ and a clock frequency $f_{CLK}$ as a switching frequency for switching each of the semiconductor switch elements 20a to 20d. The PWM signals can be generated by comparing a signal wave (e.g., a sine wave) having the modulation frequency $f_M$ and a triangle wave having the clock frequency $f_{CLK}$ by a comparator. The PWM signals supplied to the gate terminals 21a to 21d have the same clock frequency $f_{CLK}$. Resistances $R_{CO}$ between the respective semiconductor switch elements 20a to 20d and the corresponding drive circuits 30a to 30d represent output impedances of the drive circuits 30a to 30d respectively connected to the gate terminals 21a to 21d of the semiconductor switch elements 20a to 20d. Third power sources P3a to P3d are respectively connected between the source terminals 23a to 23d of the semiconductor switch elements 20a to 20d and the drive circuits 30a to 30d. Positive poles of the third power sources P3a to P3d are connected to the corresponding source terminals 23a to 23d. Negative poles of the third power sources P3a to P3d are connected to the corresponding drive circuits 30a to 30d. Accordingly, predetermined negative voltages based on the source terminals 23a to 23d are supplied to the drive circuits 30a to 30d. The magnitude of the predetermined negative voltage is −11 V, for example.

In the above configuration, while the drive circuits 30a and 30d supply the positive-phase PWM signals to the semiconductor switch elements 20a and 20d, the drive circuits 30b and 30c supply the negative-phase PWM signals to the semiconductor switch elements 20b and 20c. Thus, when the semiconductor switch elements 20a and 20d are in an ON state, the semiconductor switch elements 20b and 20c are in an OFF state. A current flows in the direction of an arrow A1 in FIG. 1. Meanwhile, when the semiconductor switch elements 20a and 20d are in the OFF state, the semiconductor switch elements 20b and 20c are in the ON state. A current flows in the direction of an arrow A2 in FIG. 1. Accordingly, the direction of a current flowing through the load 40 can be switched according to the PWM signals. Therefore, when the inductive load is employed as the load 40, the switching circuit 10A can be applied to an inverter. For example, when a motor is connected as the load 40, the motor can be driven by the switching circuit 10A.

To improve the power efficiency in accordance with the switching, the switching circuit 10A includes capacitance suppression element sections 50 respectively connected to the semiconductor switch elements 20a and 20c, and also includes capacitance elements 60 and 61. The capacitance suppression element sections 50 respectively connected to the semiconductor switch elements 20a and 20c are also referred to as capacitance suppression element sections 50a and 50c.

Figure 2:
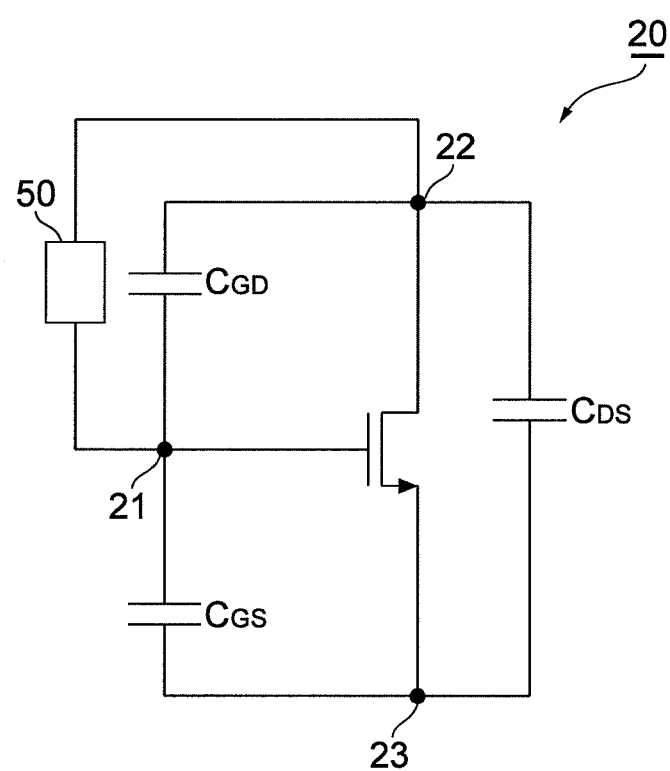
FIG. 2 is a diagram illustrating one example of the arrangement relationship between a parasitic capacitance of a semiconductor switch element and a capacitance suppression element section used in FIG. 1.

FIG. 2 is a diagram for explaining the relationship between a parasitic capacitance existing in the semiconductor switch element and the capacitance suppression element section. As shown in FIG. 2, parasitic capacitances $C_{GS}$, $C_{GD}$, and $C_{DS}$ exist between the respective terminals of the semiconductor switch element 20. The parasitic capacitance $C_{GS}$ is a parasitic capacitance between the gate terminal 21 and the source terminal 23. The parasitic capacitance $C_{GD}$ is a parasitic capacitance between the gate terminal 21 and the drain terminal 22. The parasitic capacitance $C_{DS}$ is a parasitic capacitance between the drain terminal 22 and the source terminal 23. In FIG. 2, the parasitic capacitances $C_{GS}$, $C_{GD}$, and $C_{DS}$ are shown as capacitance elements.

At least one capacitance suppression element section 50 is connected to the semiconductor switch element 20 so as to suppress at least one of the parasitic capacitances $C_{GS}$, $C_{GD}$, and $C_{DS}$. The capacitance suppression element section 50 is connected between the terminals where the parasitic capacitance $C_{GS}$, $C_{GD}$, or $C_{DS}$ to be suppressed exists. In this case, the capacitance suppression element section 50 is connected in parallel with the parasitic capacitance $C_{GS}$, $C_{GD}$, or $C_{DS}$ to be suppressed. FIG. 2 shows one example in which the capacitance suppression element section 50 is connected between the gate terminal 21 and the drain terminal 22 to suppress the parasitic capacitance $C_{GD}$. The parasitic capacitance to be suppressed by the capacitance suppression element section 50 out of the parasitic capacitances $C_{GS}$, $C_{GD}$, and $C_{DS}$ is referred to as parasitic capacitance C.

The capacitance suppression element section 50 suppresses the parasitic capacitance $C_X$ of the semiconductor switch element 20 at a frequency N times (N is an integer of 1 or more) as high as the clock frequency of the PWM signal. The capacitance suppression element section 50 is configured to satisfy following conditions.

Condition (i): An impedance of the parasitic capacitance $C_X$ and an impedance of the capacitance suppression element section 50 are equal in magnitude to each other, and have opposite signs from each other at an angular frequency of an N-th order harmonic of the clock frequency of the PWM signal.

Condition (ii): An output impedance $R_{CO}$ of the drive circuit 30 connected to the gate terminal 21 of the semiconductor switch element 20 is sufficiently smaller than an input impedance of the semiconductor switch element 20. In the circuit configuration shown in FIG. 1, output impedances with respect to the semiconductor switch elements 20a to 20d are output impedances of the drive circuits 30a to 30d, and correspond to resistance values of the resistances $R_{CO}$ shown between the respective semiconductor switch elements 20a to 20d and the corresponding drive circuits 30a to 30d.

When a reactance of the capacitance suppression element section 50 is $X(\omega)$ as a function of an angular frequency $\omega$, the above (i) is expressed by an expression (1), and the above (ii) is expressed by an expression (2). That is, the capacitance suppression element section 50 is configured to satisfy the expressions (1) and (2). In the following description, $X(\omega)$ is also referred to as reactance curve of the capacitance suppression element section 50.

[Expression 1]

$$jX(n\varpi_0) = -\frac{1}{jn\varpi_0 C_X} \quad (n = 1, 2, \ldots, N) \quad (1)$$

[Expression 2]

$$\left| \frac{1}{j\varpi_M C_X + \frac{1}{jX(\varpi_M)}} \right| = \alpha R_{CO} (\alpha \gg 1) \quad (2)$$

In the expressions (1) and (2), j represents an imaginary unit, $\omega_0$ represents a product of the clock frequency $f_{CLK}$ of the PWM signal and $2\pi$, $\omega_M$ represents a product of the modulation frequency $f_M$ of the PWM signal and $2\pi$ and $C_X$ represents the parasitic capacitance between the terminals of the semiconductor switch element 20 where the capacitance suppression element section 50 is connected. For example, when the capacitance suppression element section 50 is connected between the gate terminal 21 and the drain terminal 22, $C_X = C_{GD}$. As described above, $R_{CO}$ represents the output impedance of the drive circuit 30 connected to the gate terminal 21 of the semiconductor switch element 20. In the expression (2), α may be sufficiently greater than 1. For example, α may be 10 or more, or may be 100 or more.

When the capacitance suppression element section 50 is connected between the terminals where the parasitic capacitance $C_X$ to be cancelled exists out of the parasitic capacitances $C_{GS}$, $C_{GD}$, and $C_{DS}$ between the terminals of the semiconductor switch element 20, the capacitance suppression element section 50 is connected in parallel with the parasitic capacitance $C_X$. When the capacitance suppression element section 50 satisfies the expressions (1) and (2), a combined impedance of the capacitance suppression element section 50 and the parasitic capacitance $C_X$ in parallel therewith has a very high value (e.g., an infinity ∞) at the N-th order harmonic of the clock frequency $f_{CLK}$ of the PWM signal. Thus, the semiconductor switch element 20 to which the capacitance suppression element section 50 satisfying the expressions (1) and (2) is connected can operate as in a case in which the parasitic capacitance $C_X$ between the terminals where the capacitance suppression element section 50 is connected practically does not exist. That is, the capacitance suppression element section 50 can reduce the parasitic capacitance $C_X$ of the semiconductor switch element 20 in the operation of the semiconductor switch element 20.

Figure 3:
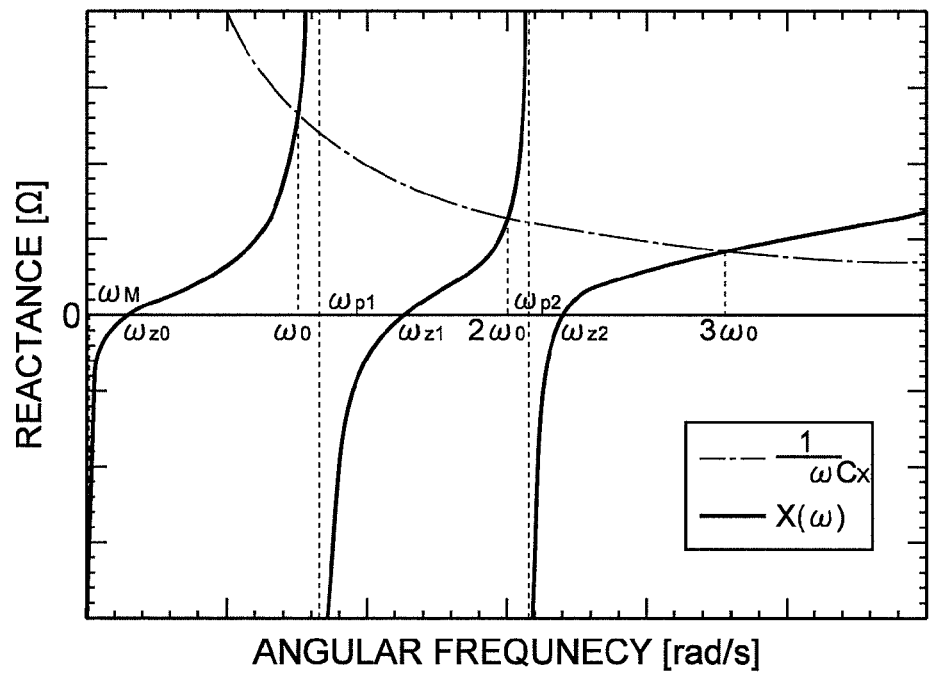
FIG. 3 is a graph showing the relationship between a reactance curve of the capacitance suppression element section and a reactance curve of the parasitic capacitance.

FIG. 3 is a graph showing the relationship between a reactance curve of the capacitance suppression element section and a reactance curve of the parasitic capacitance, and corresponds to the relationship of the expression (1). FIG. 3 shows a case of N=3 as one example. In FIG. 3, a horizontal axis represents an angular frequency ω, and a vertical axis represents a reactance [Ω]. A solid line in FIG. 3 represents the reactance curve $X(\omega)$ of the capacitance suppression element section 50. A dashed dotted line in FIG. 3 represents the reactance curve $(1/\omega C_X)$ of the parasitic capacitance. In FIG. 3, the reactance curve of the parasitic capacitance $C_X$ is a curve representing an absolute value of a reactance of the parasitic capacitance $C_X$, $\omega_{pn}$ represents an angular frequency of an n-th pole from a direct current (i.e., ω=0), and $\omega_{z(n-1)}$ represents an angular frequency that satisfies $X(\omega)=0$ as an n-th angular frequency from the direct current.

Referring to FIG. 3, the reactance function $X(\omega)$ of the capacitance suppression element section 50 having the minimum number of elements constituting the capacitance suppression element section 50 can satisfy an expression (3).

[Expression 3]

$$jX(\varpi) = \frac{\beta(-\varpi^2 + \varpi_{z0}^2)(-\varpi^2 + \varpi_{z1}^2)\ldots(-\varpi^2 + \varpi_{zN-1}^2)}{j\varpi(-\varpi^2 + \varpi_{p1}^2)\ldots(-\varpi^2 + \varpi_{pN-1}^2)} \quad (3)$$

In the expression (3), when t is an integer of 1 to N−1, $\omega_{pt}$, $\omega_{z0}$, and $\omega_{zt}$ are values determined so as to satisfy $0<\omega_{z0}<\omega_0$, and $t\omega_0<\omega_{pt}<\omega_{zt}<(t+1)\omega_0$, and also satisfy the expressions (1) and (2), and β is any value determined so as to satisfy the expressions (1) and (2).

Figure 4:
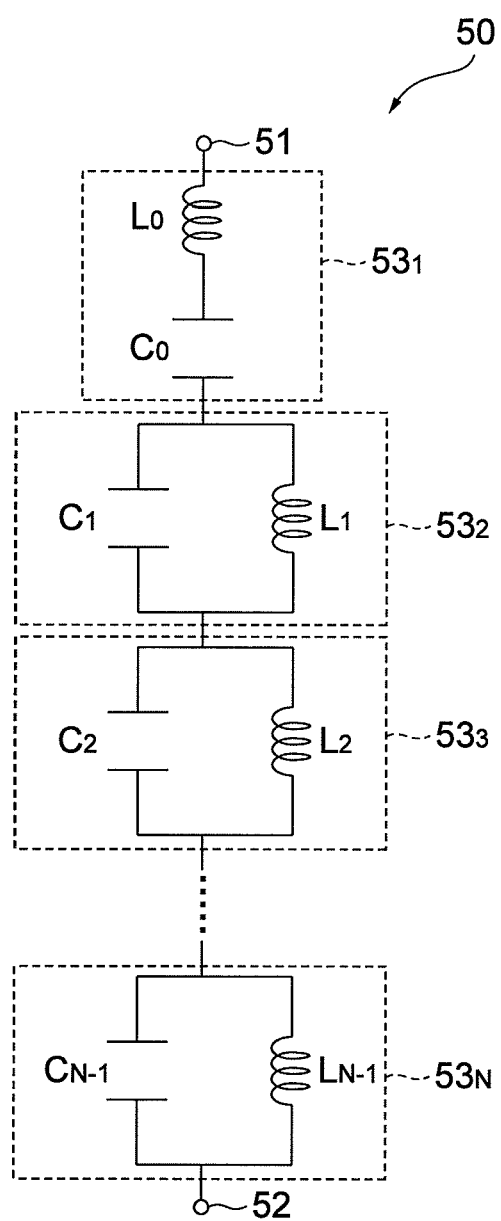
FIG. 4 is a diagram illustrating one example of the circuit configuration of the capacitance suppression element section.

FIG. 4 is a diagram illustrating one example of the circuit configuration of the capacitance suppression element section 50 that satisfies the expression (3). The capacitance suppression element section 50 has N circuit sections of first to N-th circuit sections $53_1$ to $53_N$ connected in series between terminals 51 and 52 of the capacitance suppression element section 50. The first circuit section $53_1$ is obtained by connecting a capacitance element $C_0$ and an inductance element $L_0$ in series. In this case, the first circuit section $53_1$ is a series circuit. In a case of N=1, the capacitance suppression element section 50 may be composed only of the first circuit section $53_1$. When N is 2 or more, an i-th circuit section $53_i$ (i is an integer of 2 to N) out of the second to N-th circuit sections $53_2$ to $53_N$ is obtained by connecting a capacitance element $C_{i-1}$ and an inductance element $L_{i-1}$ in parallel. As shown in FIG. 4, the i-th circuit section $53_i$ constitutes a parallel resonant circuit. In the configuration shown in FIG. 4, the parasitic capacitance can be reduced with respect to another harmonic by increasing the parallel resonant circuit by one stage. As is also understood from the circuit configuration, when the parasitic capacitance can be reduced with respect to the N-th order harmonic, the parasitic capacitance can be also reduced with respect to any harmonic other than the N-th order harmonic by increasing the number of stages of the parallel resonant circuit. It is not necessary to reduce the parasitic capacitance sequentially from a lowest order harmonic. It is also not necessary to reduce the parasitic capacitance only with respect to a next-order harmonic. For example, the parasitic capacitance may be reduced with respect to harmonics of every two orders such as odd orders of 1, 3, 5, 7 and so on.

One example of a method for calculating element values of the capacitance elements $C_0, C_1, \ldots,$ and $C_{N-1}$, and the inductance elements $L_0, L_1, \ldots,$ and $L_{N-1}$ of the capacitance suppression element section 50 in the configuration shown in FIG. 4 will be described.

In the configuration shown in FIG. 4, the expression (3) can be transformed into an expression (4).

[Expression 4]

$$jX(\varpi) = j\varpi L_0 + \frac{1}{j\varpi C_0} + \frac{1}{C_1} \frac{j\varpi_0}{-\varpi_0^2 + \varpi_{p1}^2} + \frac{1}{C_2} \frac{j\varpi_0}{-\varpi_0^2 + \varpi_{p2}^2} + \ldots + \frac{1}{C_{N-1}} \frac{j\varpi_0}{-\varpi_0^2 + \varpi_{pN-1}^2} \quad (4)$$

Please note that $L_1 = 1/(C_1(\omega_{p1})^2)$, $L_2 = 1/(C_2(\omega_{p2})^2)$, ..., and $L_{N-1} = 1/(C_{N-1}(\omega_{p(N-1)})^2)$.

An expression (5) is obtained by substituting the expression (4) into the expressions (1) and (2), and thereafter performing a matrix calculation.

[Expression 5]

$$\begin{bmatrix} \varpi_0 & \frac{-1}{\varpi_0} & \frac{\varpi_0}{-\varpi_0^2 + \varpi_{p1}^2} & \cdots & \frac{\varpi_0}{-\varpi_0^2 + \varpi_{pN-1}^2} \\ 2\varpi_0 & \frac{-1}{2\varpi_0} & \frac{2\varpi_0}{-2^2\varpi_0^2 + \varpi_{p1}^2} & \cdots & \frac{2\varpi_0}{-2^2\varpi_0^2 + \varpi_{pN-1}^2} \\ \vdots & \vdots & \vdots & \ddots & \vdots \\ N\varpi_0 & \frac{-1}{N\varpi_0} & \frac{N\varpi_0}{-N^2\varpi_0^2 + \varpi_{p1}^2} & \cdots & \frac{N\varpi_0}{-N^2\varpi_0^2 + \varpi_{pN-1}^2} \\ \varpi_M & \frac{-1}{\varpi_M} & \frac{\varpi_M}{-\varpi_M^2 + \varpi_{p1}^2} & \cdots & \frac{\varpi_M}{-\varpi_M^2 + \varpi_{pN-1}^2} \end{bmatrix} \begin{bmatrix} L_0 \\ \frac{1}{C_0} \\ \frac{1}{C_2} \\ \vdots \\ \frac{1}{C_{N-1}} \end{bmatrix} = \begin{bmatrix} \frac{1}{\varpi_0 C_X} \\ \frac{1}{2\varpi_0 C_X} \\ \vdots \\ \frac{1}{N\varpi_0 C_X} \\ \frac{\alpha R_{CO}}{-1 + \alpha R_{CO}\varpi_M C_X} \end{bmatrix} \quad (5)$$

$\omega_{p1}$ to $\omega_{p(N-1)}$ is given within a range of $0<\omega_{z0}<\omega_0$, and $t\omega_0 < \omega_{pt} < \omega_{zt} < (t+1)\omega_0$ (t is an integer of 1 to N−1). The respective element values can be thereby obtained from the expression (5).

In the following, the case of N=3 will be specifically described. In this case, the expressions (4) and (5) are expressed as in next expressions (6) and (7).

[Expression 6]

$$jX(\varpi) = j\varpi L_0 + \frac{1}{j\varpi C_0} + \frac{1}{C_1} \frac{j\varpi_0}{-\varpi_0^2 + \varpi_{p1}^2} + \frac{1}{C_2} \frac{j\varpi_0}{-\varpi_0^2 + \varpi_{p2}^2} \quad (6)$$

[Expression 7]

$$\begin{bmatrix} \varpi_0 & \frac{-1}{\varpi_0} & \frac{\varpi_0}{-\varpi_0^2 + \varpi_{p1}^2} & \frac{\varpi_0}{-\varpi_0^2 + \varpi_{p2}^2} \\ 2\varpi_0 & \frac{-1}{2\varpi_0} & \frac{2\varpi_0}{-4\varpi_0^2 + \varpi_{p1}^2} & \frac{2\varpi_0}{-4\varpi_0^2 + \varpi_{p2}^2} \\ 3\varpi_0 & \frac{-1}{3\varpi_0} & \frac{3\varpi_0}{-9\varpi_0^2 + \varpi_{p1}^2} & \frac{3\varpi_0}{-9\varpi_0^2 + \varpi_{p2}^2} \\ \varpi_M & \frac{-1}{\varpi_M} & \frac{\varpi_M}{-\varpi_M^2 + \varpi_{p1}^2} & \frac{\varpi_M}{-\varpi_0^2 + \varpi_{p2}^2} \end{bmatrix} \quad (7)$$

$$\begin{bmatrix} L_0 \\ \frac{1}{C_0} \\ \frac{1}{C_1} \\ \frac{1}{C_2} \end{bmatrix} = \begin{bmatrix} \frac{1}{\varpi_0 C_X} \\ \frac{1}{2\varpi_0 C_X} \\ \frac{1}{3\varpi_0 C_X} \\ \frac{\alpha R_{CO}}{-1 + \alpha R_{CO}\varpi_M C_X} \end{bmatrix}$$

When $\omega_M = 120\pi$ [rad/s] by setting the modulation frequency $f_M$ of the PWM signal to 60 Hz, $\omega_0 = 2400007\pi$ [rad/s], $R_{CO} = 30$ [Ω], $\alpha = 100$, $C = 1.9$ [nF], $\omega_{p1} = 264000$ [rad/s], and $\omega_{p2} = 504000$ [rad/s], $L_0, C_0, L_1, C_1, L_2,$ and $C_2$ are as follows.

$L_0 = 136.9$ [μH]
$C_0 = 882.3$ [nF]
$L_1 = 133.4$ [μH]
$C_1 = 10.9$ [nF]
$L_2 = 9.4$ [μH]
$C_2 = 28.2$ [nF]

Next, the capacitance elements 60 and 61 will be described. The capacitance element 60 is connected between the drain terminal 22b of the semiconductor switch element 20b and the gate terminal 21d of the semiconductor switch element 20d. A capacitance $C_{60}$ of the capacitance element (a first capacitance element) 60 is substantially equal to the parasitic capacitance $C_{GD}$ between the gate terminal 21d and the drain terminal 22d of the semiconductor switch element 20d at the N-th order harmonic of the PWM signal. The capacitance element 61 is connected between the gate terminal 21b of the semiconductor switch element 20b and the drain terminal 22d of the semiconductor switch element 20d. A capacitance $C_{61}$ of the capacitance element (a second capacitance element) 61 is substantially equal to the parasitic capacitance $C_{GD}$ between the gate terminal 21b and the drain terminal 22b of the semiconductor switch element 20b at the N-th order harmonic of the PWM signal.

In the configuration, the respective parasitic capacitances $C_{GD}$ of the semiconductor switch elements 20b and 20d can be suppressed by the capacitance elements 60 and 61. This point will be described by reference to FIG. 5.

Figure 5:
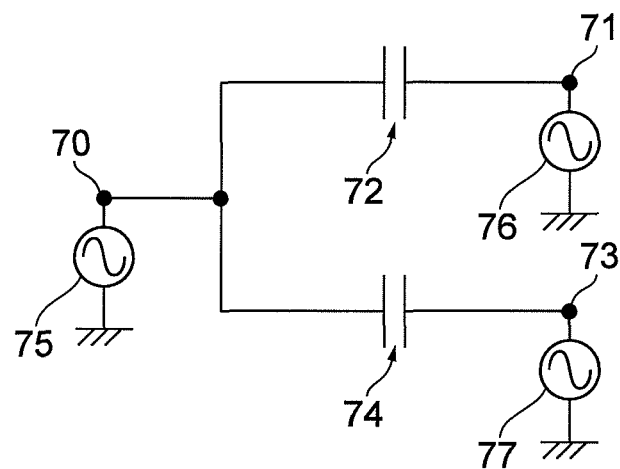
FIG. 5 is a diagram for explaining the principle that the parasitic capacitance of the semiconductor switch element can be suppressed by connecting a capacitance element.

FIG. 5 is a diagram for explaining the principle that the parasitic capacitance of the semiconductor switch element can be suppressed by connecting the capacitance element. FIG. 5 is a model diagram for calculating a capacitance component anticipated from the gate terminal 21d in the semiconductor switch element 20d.

In a circuit model shown in FIG. 5, a capacitance element 72 is connected between a first terminal 70 and a second terminal 71, and a capacitance element 74 having the same capacitance as that of the capacitance element 72 is connected between the first terminal 70 and a third terminal 73. The capacitance element 72 represents the parasitic capacitance $C_{GD}$ of the semiconductor switch element 20d, and the capacitance element 74 corresponds to the capacitance element 60. A signal source 75 is connected to the first terminal 70, and voltage sources 76 and 77 are respectively connected to the second terminal 71 and the third terminal 73.

In the model shown in FIG. 5, the first terminal 70 corresponds to the gate terminal 21d of the semiconductor switch element 20d. The signal source 75 supplies a gate voltage $V_X$ to the first terminal 70 so as to represent the input of the PWM signal into the gate terminal 21d. The second terminal 71 corresponds to the drain terminal 22d of the semiconductor switch element 20d. The voltage source 76 supplies a voltage $V_D$ to the second terminal 71 so as to represent the voltage of the drain terminal 22d. The third terminal 73 corresponds to the drain terminal 22b of the semiconductor switch element 20b. It is assumed that a drain potential of the drain terminal 22b of the semiconductor switch element 20b is opposite to a drain potential of the drain terminal 22d of the semiconductor switch element 20d. Thus, a drain voltage ($-V_D$) is supplied to the third terminal 73 from the voltage source 77.

An amount of charge flowing into the first terminal 70 as the gate terminal 21d from the second terminal 71 and the third terminal 73 is $C_{GD}(V_D-V_X)+C_{GD}(-V_D-V_X)=-2C_{GD}V_X$. Thus, the parasitic capacitance $C_{GD}$ between the gate and the drain equivalently does not exist, and it appears that a capacitance having the value of $2C_{GD}$ exists between the gate terminal 21d and the ground (that is, the source terminal).

Accordingly, when the capacitance element 60 is provided as shown in FIG. 1, the parasitic capacitance $C_{GD}$ between the gate and the drain equivalently does not exist at the N-th order harmonic (a so-called fundamental wave in the case of N=1) of the PWM signal. Thus, the influence of the parasitic capacitance $C_{GD}$ of the semiconductor switch element 20d can be neutralized or cancelled. Although the semiconductor switch element 20d has been mainly described, the same applies to the semiconductor switch element 20b. That is, when the capacitance element 61 is provided as shown in FIG. 1, the influence of the parasitic capacitance $C_{GD}$ of the semiconductor switch element 20b can be neutralized or cancelled at the N-th order harmonic of the PWM signal.

Although it is described that the capacitance elements 60 and 61 neutralize the influence of the parasitic capacitance $C_{GD}$, the capacitance elements 60 and 61 only need to reduce or suppress the influence of the parasitic capacitance $C_{GD}$. For example, the capacitances of the capacitance elements 60 and 61 may be set to values with which an equivalent capacitance becomes 1/10 or less of the original parasitic capacitance $C_X$ by connecting the capacitance elements 60 and 61. The capacitances of the capacitance elements 60 and 61 may be also set to values with which the equivalent capacitance becomes half or less of the original parasitic capacitance $C_X$.

In the switching circuit 10A, the capacitance suppression element sections 50a and 50c achieve a state in which the parasitic capacitance $C_X$ ($C_X=C_{GD}$ in one example shown in FIGS. 1 and 2) practically does not exist at the N-th order harmonic of the clock frequency $f_{CLK}$ of the PWM signal with respect to the semiconductor switch elements 20a and 20c. The capacitance elements 60 and 61 also achieve a state in which the parasitic capacitance $C_{GD}$ practically does not exist at the N-th order harmonic of the clock frequency $f_{CLK}$ of the PWM signal with respect to the semiconductor switch elements 20b and 20d. A time required to charge and discharge the parasitic capacitance $C_X$ and the parasitic capacitance $C_{GD}$ in the switching can be thereby reduced, so that the switching is performed at higher speed in the semiconductor switch elements 20a to 20d. As a result, the switching speed of the switching circuit 10A can be increased, and the power efficiency of the switching circuit 10A can be improved. Moreover, since the influence of the parasitic capacitance $C_{GD}$ is reduced by using the capacitance elements 60 and 61 with respect to the semiconductor switch elements 20b and 20d, the switching circuit 10A can be more easily designed.

Overdrive may be performed as a method for increasing the switching speed of the switching circuit 10A using the semiconductor switch elements 20a to 20d. However, in this case, the configurations of the drive circuits 30a to 30d may become complicated so as to perform the overdrive as compared to a case in which the overdrive is not performed. The drive circuits 30a to 30d also need to have a higher ampacity so as to perform the overdrive. Accordingly, the drive circuits 30a to 30d may be increased in size, or the power efficiency of the switching circuit 10A including the drive circuits 30a to 30d may be reduced as compared to the case in which the overdrive is not performed. In this case, even when the high-speed switching is achieved by the overdrive, an improvement in the power efficiency by the high-speed switching itself may not be obtained.

Meanwhile, in the switching circuit 10A, the capacitance suppression element sections 50a and 50c reduce the influences of the parasitic capacitances $C_X$ themselves of the semiconductor switch elements 20a and 20c, and the capacitance elements 60 and 61 reduce the influences of the parasitic capacitances $C_{GD}$ themselves of the semiconductor switch elements 20b and 20d, to achieve the high-speed switching. Accordingly, the switching speed of the switching circuit 10A can be increased and the power efficiency can be improved as described above without performing the overdrive.

Figure 6:
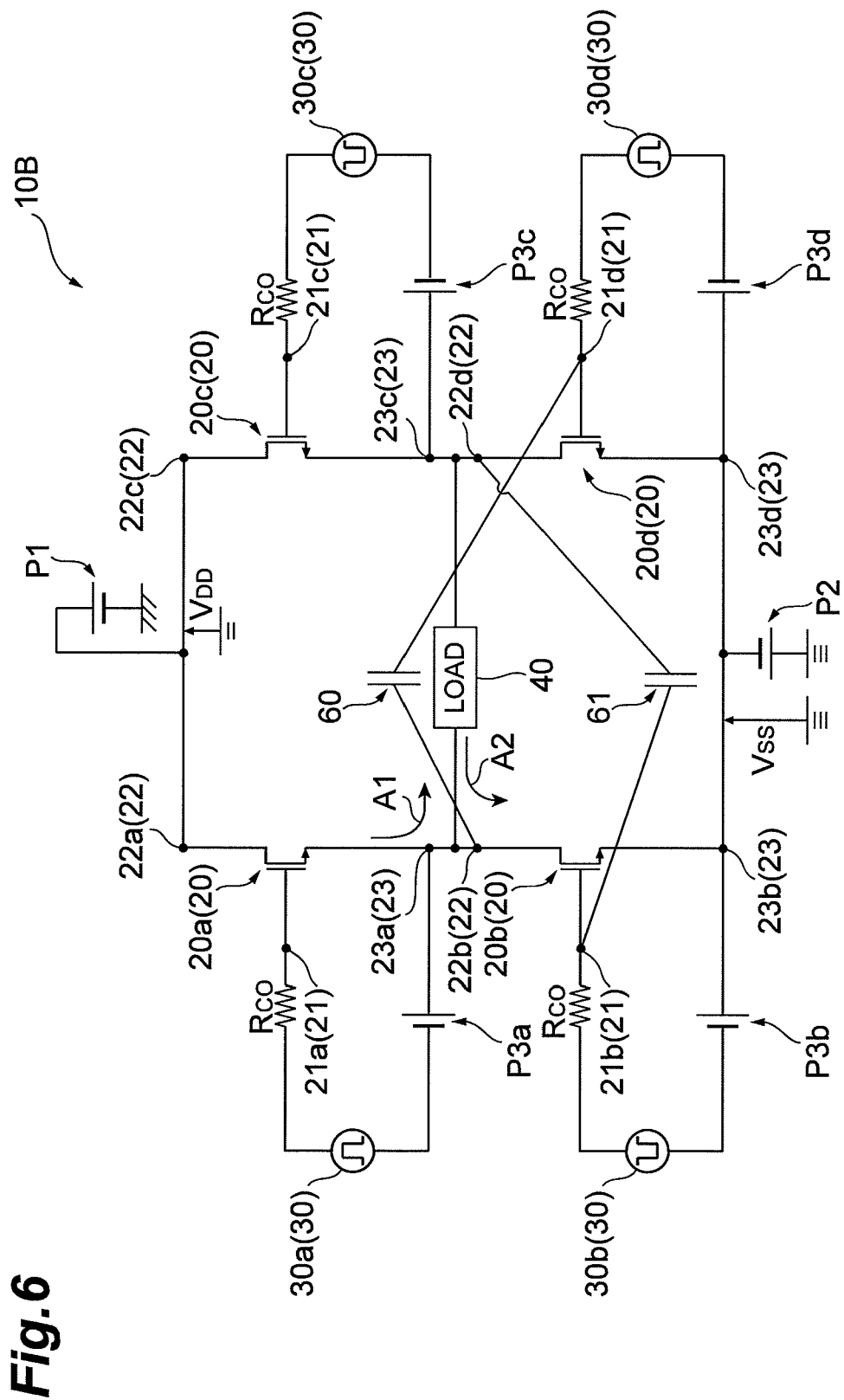
FIG. 6 is a circuit diagram illustrating one example of the schematic configuration of a switching circuit according to another embodiment.

Although the configuration in which the switching circuit 10A includes the capacitance suppression element sections 50 has been described in the present embodiment, the switching circuit 10A may not include the capacitance suppression element sections 50 as in a switching circuit 10B shown in FIG. 6. The switching circuit 10B has the same configuration as that of the switching circuit 10A except that the switching circuit 10B does not include the capacitance suppression element sections 50.

The point that the switching speed is improved by providing the capacitance elements 60 and 61 in the switching circuit 10B will be described by reference to simulation results. Simulations were performed by using NGSPICE.

Figure 7:
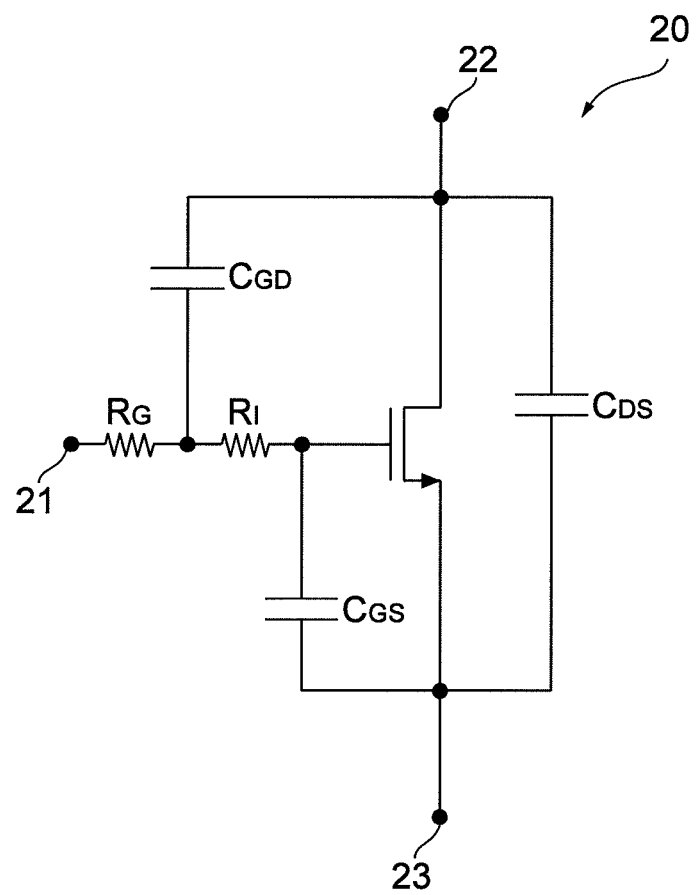
FIG. 7 is a model diagram of a semiconductor switch element for simulations.

FIG. 7 is a diagram illustrating a model of a semiconductor switch element for simulations. A MOS field-effect transistor was assumed to be used as the semiconductor switch element 20. It was assumed that parasitic resistances $R_G$ and $R_I$ existed in addition to the parasitic capacitances $C_{GS}$, $C_{DS}$, and $C_{GD}$ in the semiconductor switch element 20.

Device parameters of the semiconductor switch element 20 were set as follows.

Threshold voltage $V_T$=2 V

Transfer conductance parameter K=420 mS/V

Channel length modulation coefficient $\lambda$=0 mV$^{-1}$

Parasitic capacitance $C_{GS}$ between the gate and the source: 700 pF

Parasitic capacitance $C_{DS}$ between the drain and the source: 77 pF

Parasitic capacitance $C_{GD}$ between the gate and the drain: 63 pF

Parasitic resistance $R_G$=1 mΩ

Parasitic resistance $R_1$=1 mΩ

Figure 8:
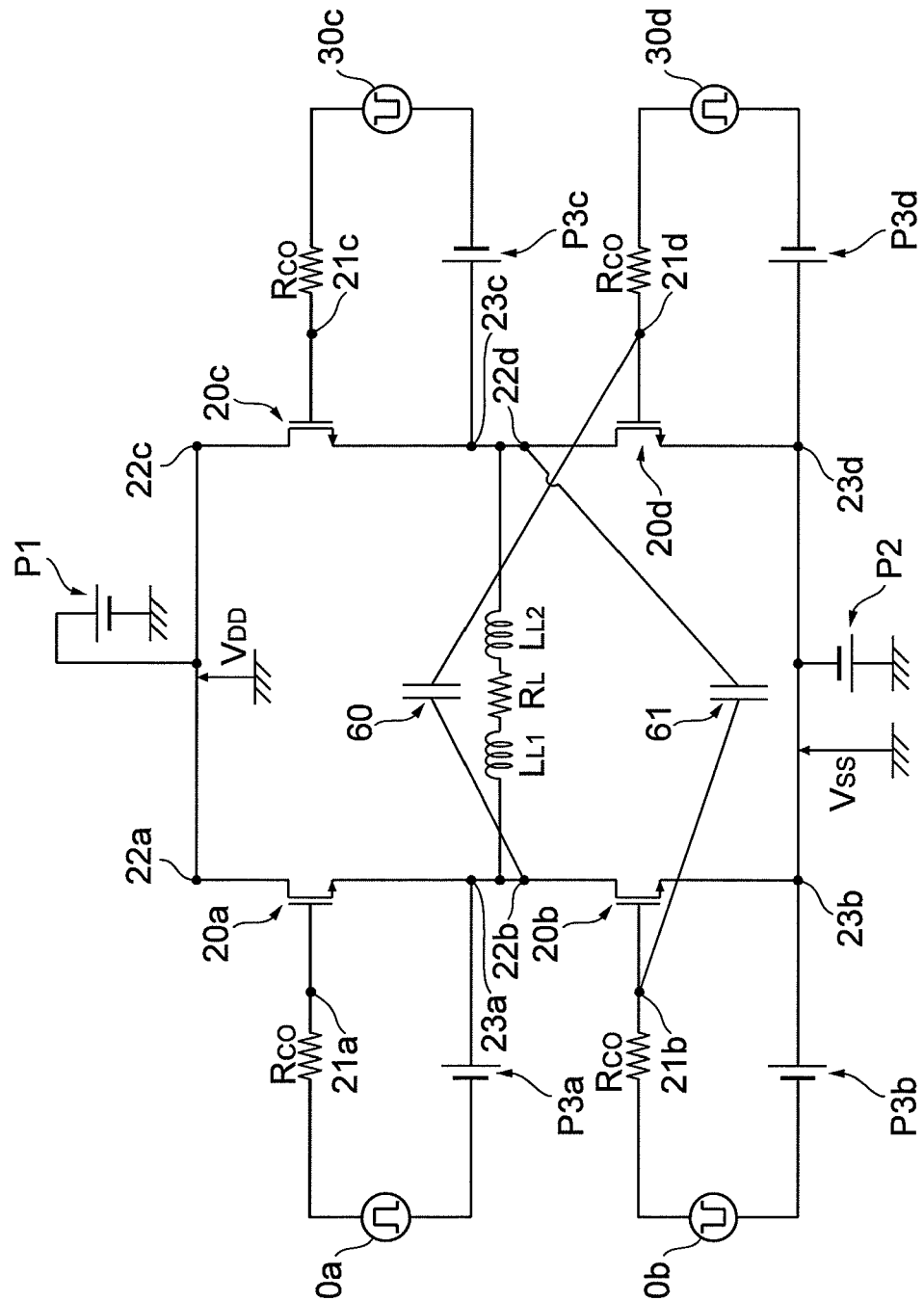
FIG. 8 is a circuit diagram for simulations corresponding to the switching circuit shown in FIG. 6.

FIG. 8 is a model diagram for simulations corresponding to the switching circuit 10B shown in FIG. 6. In the following, elements corresponding to those in FIG. 6 are assigned the same reference numerals for the convenience of description. In a circuit model shown in FIG. 8, the load 40 is represented by a series circuit of an inductance element $L_{L1}$, a resistance $R_L$, and an inductance element $L_{L2}$. In simulations, a voltage to the ground of the connection point between the source terminal 23a of the semiconductor switch element 20a and the drain terminal 22b of the semiconductor switch element 20b was set as an output voltage $V_{out}$. In the simulation circuit model, the capacitance elements 60 and 61 had a capacitance of 63 pF similarly to the parasitic capacitance $C_{GD}$ between the gate and the drain.

Element values or the like in the simulation circuit model shown in FIG. 8 were set as follows.

Clock frequency $f_{CLK}$ of the PWM signal supplied from the drive circuits 30a to 30d: 120 kHz Modulation frequency $f_M$ of the PWM signal supplied from the drive circuits 30a to 30d: 60 kHz Resistance value of the resistance $R_{CO}$: 30 Ω

Positive voltage $V_{DD}$ supplied to the drain terminals 22a and 22c: 400 V

Negative voltage $V_{SS}$ supplied to the source terminals 23b and 23d: −400 V

Voltage supplied to the drive circuits 30a to 30d based on the source terminals 23a to 23d from the third power sources P3a to P3d: −13 V Element value (inductance) of the inductance elements $L_{L1}$ and $L_{L2}$: 2.5×½ mH Element value (resistance value) of the resistance $R_L$: 10Ω

Following simulations 1 and 2 were performed as the simulation.

[Simulation 1]

The simulation was performed by assuming a case in which the capacitance elements 60 and 61 were not connected, that is, by setting the capacitances of the capacitance elements 60 and 61 to 0. In the simulation, all the parasitic capacitances of each of the semiconductor switch elements 20a to 20d were set to the values indicated as the device parameters.

[Simulation 2]

The simulation was performed by assuming that the capacitance elements 60 and 61 were connected, that is, by setting the capacitances of the capacitance elements 60 and 61 to 63 pF.

Figure 9:
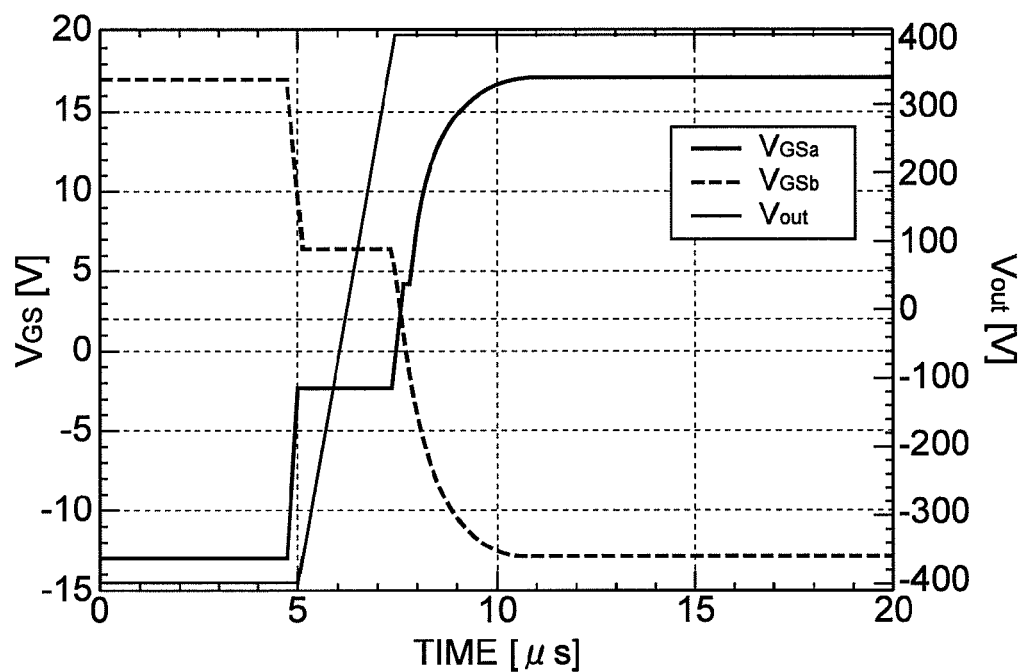
FIG. 9 is a graph showing a simulation result of a case in which each of four semiconductor switch elements shown in FIG. 8 has all parasitic capacitances, and no capacitance element is connected.
Figure 10:
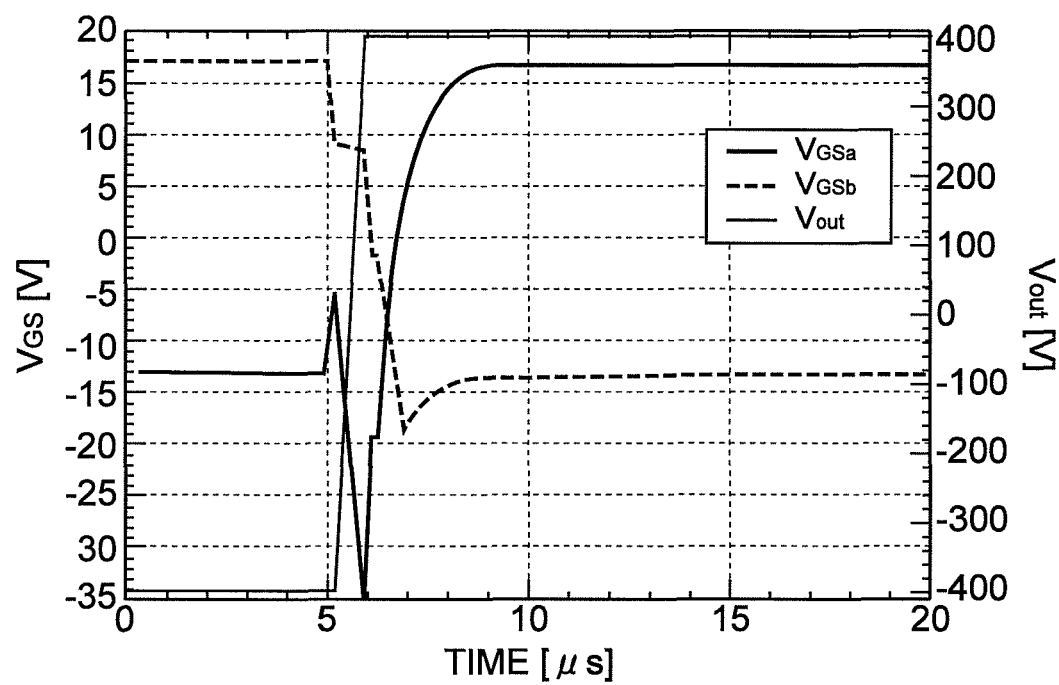
FIG. 10 is a graph showing a simulation result of a case in which a capacitance element is assumed to be connected.

FIGS. 9 and 10 are graphs respectively showing the results of the simulations 1 and 2. FIGS. 9 and 10 show changes in voltages $V_{GSa}$ and $V_{GSb}$ between the gate and the source of the semiconductor switch elements 20a and 20b, and the output voltage $V_{out}$ with respect to time. A horizontal axis represents the time [μs], and a vertical axis represents the voltages $V_{GS}$ [V] between the gate and the source and the output voltage $V_{out}$ [V]. FIGS. 9 and 10 show $V_{GSa}$ as $V_{GS}$ in the semiconductor switch element 20a at an upper left position in FIG. 8, $V_{GSb}$ as $V_{GS}$ in the semiconductor switch element 20b at a lower left position in FIG. 8, and the output voltage $V_{out}$ as the voltage to the ground of the connection point between the semiconductor switch element 20a and the semiconductor switch element 20b.

By comparing FIGS. 9 and 10, it can be understood that there is a more rapid change in the voltage $V_{GS}$ between the gate and the source of the semiconductor switch element 20b, and a more rapid change in the output voltage $V_{out}$ in the case in FIG. 10 in which the capacitance elements 60 and 61 are connected as compared to the case in FIG. 9, so that the switching speed can be increased. As a result, the power efficiency can be also improved by providing the capacitance elements 60 and 61.

Although various embodiments of the present invention have been described above, the present invention is not limited to the various embodiments described above, and various modifications may be made without departing from the scope of the present invention. For example, the semiconductor switch element of the switching circuit is not limited to the MOS field-effect transistor described above. For example, the semiconductor switch element may be an insulated gate bipolar transistor, a junction field-effect transistor, or a junction bipolar transistor. Alternatively, the semiconductor switch element may be a thyristor. When the semiconductor switch element is the insulated gate bipolar transistor or the junction bipolar transistor, the semiconductor switch element has a gate terminal as the input terminal, a collector terminal as the output terminal, and an emitter terminal as the common terminal. When the semiconductor switch element is the junction field-effect transistor, the semiconductor switch element has a gate terminal as the input terminal, a drain terminal as the output terminal, and a source terminal as the common terminal in a similar manner to the case of the MOS field-effect transistor. When the semiconductor switch element is the thyristor, the semiconductor switch element has a gate terminal as the input terminal, an anode terminal as the output terminal, and a cathode terminal as the common terminal.

Although it is described that the first and second capacitance elements of the switching circuit have the same configuration (or the same capacitance), the first and second capacitance elements may have different configurations according to the configurations of the semiconductor switch elements having the parasitic capacitances to be suppressed by the first and second capacitance elements. By further connecting the capacitance suppression element sections to the lower two semiconductor switch elements in FIG. 1, a parasitic capacitance other than the parasitic capacitances to be suppressed by the first and second capacitance elements may be also suppressed. Moreover, the influence of the capacitance having the value of $2C_{GD}$ as the capacitance between the gate terminal and the ground appearing to equivalently exist by the first and second capacitance elements may be substantially reduced by further connecting the capacitance suppression element section. The capacitance suppression element sections respectively connected to the upper two semiconductor switch elements in FIG. 1 may also have different configurations.

Although the pulse-like signal supplied to the semiconductor switch element is the PWM signal in the various embodiments described above, any pulse-like signal may be employed as long as the ON/OFF switching of the semiconductor switch element can be controlled.

What is claimed is:

1. A switching circuit comprising first to fourth semiconductor switch elements each having an input terminal, an output terminal, and a common terminal, an output terminal of the first semiconductor switch element and an output terminal of the third semiconductor switch element being connected to each other, a common terminal of the second semiconductor switch element and a common terminal of the fourth semiconductor switch element being connected to each other, a common terminal of the first semiconductor switch element and an output terminal of the second semiconductor switch element being connected to each other, a common terminal of the third semiconductor switch element and an output terminal of the fourth semiconductor switch element being connected to each other, and a pulse-like signal being applied to each input terminal of the first to fourth semiconductor switch elements such that the second and third semiconductor switch elements are in an OFF state when the first and fourth semiconductor switch elements are in an ON state and the second and third semiconductor switch elements are in an ON state when the first and fourth semiconductor switch elements are in an OFF state, further comprising a first capacitance element connected between the output terminal of the second semiconductor switch element and the input terminal of the fourth semiconductor switch element, a second capacitance element connected between the input terminal of the second semiconductor switch element and the output terminal of the fourth semiconductor switch element, a first capacitance suppression element section connected between the input terminal and the common terminal of the second semiconductor switch element, and a second capacitance suppression element section connected between the input terminal and the common terminal of the fourth semiconductor switch element, and wherein the first capacitance element has a capacitance to reduce a parasitic capacitance between the input terminal and the output terminal of the fourth semiconductor switch element to less than that obtained when the first capacitance element is not connected at a frequency N times (N is an integer of 1 or more) as high as a clock frequency of the pulse-like signal supplied to the fourth semiconductor switch element, and the second capacitance element has a capacitance to reduce a parasitic capacitance between the input terminal and the output terminal of the second semiconductor switch element to less than that obtained when the second capacitance element is not connected at a frequency N times (N is an integer of 1 or more) as high as a clock frequency of the pulse-like signal supplied to the second semiconductor switch element, the first capacitance suppression element section reduces a first capacitance between the input terminal and the common terminal of the second semiconductor switch element to less than that obtained when the first capacitance suppression element section is not connected, at a frequency N times (N is an integer of 1 or more) as high as a clock frequency of the pulse-like signal, the first capacitance being two times greater than a parasite capacitance between the input terminal and the output terminal of the second semiconductor switch element, and the second capacitance suppression element section reduces a second capacitance between the input terminal and the common terminal of the fourth semiconductor switch element to less than that obtained when the second capacitance suppression element section is not connected, at a frequency N times (N is an integer of 1 or more) as high as a clock frequency of the pulse-like signal, the second capacitance being two times greater than a parasite capacitance between the input terminal and the output terminal of the fourth semiconductor switch element.

2. The switching circuit according to claim 1, wherein the capacitance of the first capacitance element is substantially equal to the parasitic capacitance between the input terminal and the output terminal of the fourth semiconductor switch element, and the capacitance of the second capacitance element is substantially equal to the parasitic capacitance between the input terminal and the output terminal of the second semiconductor switch element.

\* \* \* \* \*